US007557390B2

(12) United States Patent
Okada et al.

(10) Patent No.: US 7,557,390 B2
(45) Date of Patent: Jul. 7, 2009

(54) SOLID IMAGE CAPTURING ELEMENT FOR POWER SAVING AT OUTPUT SECTION AND MANUFACTURING METHOD FOR THE SAME

(75) Inventors: Yoshihiro Okada, Hashima (JP); Yuzo Otsuru, Gifu (JP)

(73) Assignee: Sanyo Electric co., Ltd., Osaka (JP)

( * ) Notice: Subject to any disclaimer, the term of this patent is extended or adjusted under 35 U.S.C. 154(b) by 977 days.

(21) Appl. No.: 10/688,073

(22) Filed: Oct. 17, 2003

(65) Prior Publication Data

US 2004/0119865 A1   Jun. 24, 2004

(30) Foreign Application Priority Data

Oct. 18, 2002   (JP)   ............... 2002-304977

(51) Int. Cl.
  *H01L 29/762* (2006.01)
(52) U.S. Cl. ............ 257/223; 257/215; 257/226; 257/238; 257/445; 257/242; 257/251; 257/230; 257/912; 257/E27.139; 257/E21.456; 257/E31.078; 257/E31.081; 257/E31.084; 257/E27.082; 257/E27.083; 257/E27.15; 257/E27.158; 257/E29.058; 257/E29.065; 257/E29.138; 257/E29.227; 257/E29.228; 257/E21.183; 257/E21.185; 257/E21.187; 257/E21.189; 257/E21.617; 257/E27.145; 257/E27.162
(58) Field of Classification Search ............ None
  See application file for complete search history.

(56) References Cited

U.S. PATENT DOCUMENTS

| 4,805,026 | A | * | 2/1989 | Oda | ............ 348/320 |
|---|---|---|---|---|---|
| 5,040,038 | A | * | 8/1991 | Yutani et al. | ............ 257/232 |
| 5,220,185 | A | * | 6/1993 | Wada | ............ 257/239 |
| 5,283,451 | A | * | 2/1994 | Cazaux | ............ 257/229 |
| 5,619,049 | A | | 4/1997 | Kim | |
| 5,898,195 | A | * | 4/1999 | Harada | ............ 257/223 |
| 6,011,282 | A | | 1/2000 | Nakashiba | |
| 6,018,169 | A | * | 1/2000 | Tohyama | ............ 257/222 |
| 6,426,238 | B1 | * | 7/2002 | Morimoto | ............ 438/52 |
| 2002/0039144 | A1 | * | 4/2002 | Yamada | ............ 348/311 |

FOREIGN PATENT DOCUMENTS

| JP | 7-050402 | 2/1995 |
|---|---|---|
| JP | 10-163471 | 6/1998 |
| JP | 1998-041919 | 8/1998 |
| KR | 97-007711 | 5/1997 |

* cited by examiner

*Primary Examiner*—Minh-Loan T Tran
*Assistant Examiner*—Fei Fei Yeung Lopez
(74) *Attorney, Agent, or Firm*—Hogan & Hartson LLP

(57) ABSTRACT

A solid image capturing element comprising a plurality of vertical shift registers arranged to each correspond to a column of a plurality of light receiving pixels in a matrix arrangement, a horizontal shift register provided on an output side of the plurality of vertical shift registers, and an output section provided on an output side of the horizontal shift register. In this solid image capturing element, a reverse conductive semiconductor region is formed over one major surface of one conductive semiconductor substrate, the plurality of light receiving pixels, the plurality of vertical shift registers, the horizontal shift register, and the output section are formed in the semiconductor region, and a portion of the semiconductor region where the output section is formed has a higher dopant concentration than the portion of the semiconductor region where the horizontal shift register is formed.

6 Claims, 7 Drawing Sheets

SOLID IMAGE CAPTURING ELEMENT FOR POWER SAVING AT OUTPUT SECTION AND MANUFACTURING METHOD FOR THE SAME

BACKGROUND OF THE INVENTION

1. Field of the Invention

The present invention relates to a CCD solid image capturing element and a method for manufacturing the same. In particular, the present invention relates to suppression of power consumption in an output section.

2. Description of the Related Art

FIG. 4 schematically shows a structure of a CCD solid image capturing element using a frame transfer method. Specifically, a CCD solid image capturing element using a frame transfer method comprises an image capturing section i, a storage section s, a horizontal transfer section h, and an output section d.

The image capturing section i generates information charges in a two-dimensional array and transfers the charges at a high speed to the storage section s. The information charges are stored in the storage section s and also transferred to the subsequent horizontal transfer section h for every pixel row. The information charges are then transferred to the output section d for each pixel. The output section d converts the information charge for one pixel into a voltage having a corresponding value. A change in the voltage value is output as a CCD output.

FIGS. 5 and 6 are cross sectional views showing major elements of a conventional CCD solid image capturing element. In particular, FIG. 5 is a cross sectional view along the charge transfer direction in a vertical shift register, showing an output end of a vertical shift register (V-REG) constituting the storage section s and its nearby portions. FIG. 5 additionally shows a horizontal transfer section h coupled to the output end of the storage section s. FIG. 5 is a cross sectional view along the charge transfer direction in the horizontal shift register, showing an output end of the horizontal shift register (H-REG) and its nearby portions. FIG. 5 additionally shows a floating diffusion layer (FD) 18 and a reset drain (RD) 20, which constitute a part of the output section d.

Specifically, in an N-type silicon substrate 2, an N-well (NW) 4, a P-well (PW) 8 or 10, and an N-type layer ($N_{sub}$) 6 are formed, in that order downward from the surface of the silicon substrate 2, through ion implantation and subsequent diffusion. Specifically, the N-well 4 is an N-type layer formed on the surface of the substrate, and the P-well 8 or 10 is a P-type layer underlying the N-well 4. The N-type layer 6 is apart of the original substrate.

Referring to FIG. 5, an information charge is sequentially transferred in the rightward direction in the drawing through potential wells formed in the N-well 4 in the vertical shift register until it is read into a potential well formed below an electrode 14-1 in the horizontal shift register. Meanwhile, referring to FIG. 6, the information charge is transferred in the leftward direction in the drawing through potential wells formed in the N-well 4 in the horizontal shift register until it finally reaches, passing under the output gate (OG) 16, the floating diffusion layer 18.

The floating diffusion layer 18 is an $N^+$ diffusion layer and its potential is set at a reset drain potential $V_{RD}$ of the reset drain 20 when the adjacent reset gate (RG) 22 is turned on. When an information charge is supplied from the horizontal shift register to the floating diffusion layer 18, the potential of the floating diffusion layer 18 is caused to vary according to the amount of the charge supplied from the horizontal shift register. This potential variation is detected and amplified by an output amplifier 30, which in turn outputs a voltage $V_{OUT}$ as a CCD output.

The output amplifier 30 also is formed in the semiconductor region on the surface of the silicon substrate 2. Specifically, the drain and source of the MOS transistor 32, 34 of the output amplifier 30 are formed by $N^+$ diffusion layers on the surface of the substrate 2 and a channel formed in the semiconductor substrate region between the drain and the source is controlled using a gate electrode which is formed by polysilicon electrode layers on gate oxide films.

When the P-well 10 and the N-well 4 are formed in the N-type substrate 2, as described above, an NPN structure is formed in the substrate. In this structure, redundant charges on the surface of the substrate can be discharged into the depths in the substrate.

FIG. 7 schematically shows a potential distribution downward into the substrate. In the drawing, the abscissa corresponds to the distance in the depth direction of the substrate with its leftward direction corresponding to the surface of the substrate 2 (that is, the gate oxide film side) and its rightward direction corresponding to the back side of the substrate 20. The ordinate of the drawing corresponds to a potential with its lower direction corresponding to a positive potential direction (in which, in this embodiment, a potential becomes deeper). The potential distribution curve 42 corresponds to the horizontal transfer section h (H-REG), while the potential distribution curve 40 corresponds to the image capturing section i and the storage section s.

As shown, because a predetermined positive voltage $V_{sub}$ (for example, 5V) and a positive voltage VS corresponding to an on stage (for example, 5V) are applied to the substrate and the transfer electrode, respectively, in a vertical shift register constituting the image capturing section i or the storage section s, a potential barrier is formed in the P-well 8 and a potential well is formed in the N-well 4. Because the electron tends to flow from a place with a shallower potential to a place with a deeper potential in the silicon substrate 2, that is, from a projected portion of a potential distribution curve to a recessed portion thereof, in a normal operation, the information charge in a potential well in the N-well 4 is blocked by the potential barrier in the p-well 8 from flowing into the depths in the substrate 2.

When a higher substrate voltage $V_{sub}$ or a lower positive voltage VS is applied, the potential well in the N-well 4 becomes shallower and the potential barrier in the P-well 8 becomes lower, which allows the information charge in the N-well 4 to be discharged into the depths of the substrate. In an electronic shutter operation, for example, a voltage to be applied to the substrate side or the transfer electrode may be manipulated in such a manner that information charge in the image capturing section i or the storage section s could be instantly discharged therefrom to thereby reset the section.

In a vertical over flow drain (VOD) structure as described above, an excessive information charge in a light receiving pixel in the image capturing section i can be discharged, over the potential barrier in the P-well 8, into the depths in the substrate. Therefore, a problem known as "blooming", that is, leakage of information charge to other pixels can be prevented.

It should be noted that FIG. 7 additionally shows a potential distribution curve 44 which represents a potential in a region below the reset drain 20 of the output section d and the drive transistor 32 of the output amplifier 30. This region exhibits the potential characteristic as shown, as a power voltage $V_{DD}$ (for example, 5V) is supplied to the reset drain 20 of the output section d and a drain diffusion layer of the drive transistor 32.

The above described discharging of information charge into the depths of a substrate is mainly advantageous in the image capturing section i and the storage section s, and not in the horizontal transfer section h and the output section d. Therefore, conventionally, after p-type dopant ion is doped over the entire surface of a substrate where an image capturing section i, a storage section s, a horizontal transfer section h, and a output section d are to be formed, p-type dopant ion is further doped only to a region where the horizontal transfer section h and the output section d are to be formed while covering, using a mask, a region where the image capturing section i and the storage section s are to be formed.

Consequently, concentration of p-type dopant in the P-well 10 below the horizontal transfer section h and the output section d results in higher than that in the P-well 8 in the image capturing section i and the storage sections. An example of such a difference in dopant concentration is shown in FIG. 7. That is, a higher potential barrier is formed in the P-well in the horizontal shift register (curve 42) than in the vertical shift register (curve 40). This difference in the height of the potential barrier is resulted from the difference in dopant concentration between the relevant regions.

With this structure, it is possible to arrange, by controlling the substrate voltage $V_{sub}$ or the like, such that information charge is discharged into the depths in the substrate only in the vertical shift register but not in the horizontal shift register.

SUMMARY OF THE INVENTION

In recent years, many small and light-weight devices including a CCD solid image capturing element, such as digital cameras and portable phones with an image capturing function, have been developed and introduced into the marketplace. Because the battery used in such small, light-weight devices is generally small, reduction of power consumption is desired. Meanwhile, a CCD solid image capturing element requires a relatively large amount of current for driving an output amplifier and therefore consumes a relatively large power. For compensation for this large power consumption, a power voltage $V_{DD}$ to be applied to the output amplifier is reduced so that power consumption by the CCD solid image capturing element or the entirety of the image capturing device is reduced.

However, reduction of the applied power voltage $V_{DD}$ may lead to malfunction of the transistor of the output amplifier, which receives, at its drain, a power voltage $V_{DD}$, and outputs, via its source, an amplified output. In addition, because the transistor of the output amplifier is formed on a substrate where the CCD solid image capturing element is commonly formed, as described above, and receives, via its substrate, a substrate voltage $V_{sub}$ (for example, 5V) identical to that which is applied to the CCD solid image capturing element, a potential difference between the substrate and the drain tends to be larger than a potential difference between the drain and the source.

Further, reduction of a power voltage $V_{DD}$ leads to reduction of the depth of the potential well or the height of the potential barrier at curve 44 in FIG. 7 and, resultantly, the electron supplied from the source to the channel more likely goes over the potential barrier in the P-well and flows into the substrate side, rather than being transferred toward the drain side. In order to avoid this problem, reduction of a power voltage $V_{DD}$ to be applied to the output amplifier 30 is not acceptable. For this reason, reduction of power consumption of a CCD solid image capturing element or the entirety of an image capturing element has remained an unsolved problem.

According to one aspect of the present invention, there is provided a solid image capturing element comprising a plurality of vertical shift registers arranged each corresponding to a column of a plurality of light receiving pixels in a matrix arrangement, a horizontal shift register provided on an output side of the plurality of vertical shift registers, and an output section provided on an output side of the horizontal shift register. In this solid image capturing element, a reverse conductive semiconductor region is formed over one major surface of one conductive semiconductor substrate, the plurality of light receiving pixels, the plurality of vertical shift registers, the horizontal shift register, and the output section are formed in the semiconductor region, and dopant concentration in a portion of the semiconductor region where the output section is formed is higher than dopant concentration in another portion of the semiconductor region where the horizontal shift register is formed.

According to another aspect of the present invention, there is provided a method for manufacturing a solid image capturing element having a plurality of vertical shift registers arranged to each correspond to a column of a plurality of light receiving pixels in a matrix arrangement, a horizontal shift register provided on an output side of the plurality of vertical shift registers, and an output section provided on an output side of the horizontal shift register comprising a first step of forming a first reverse conductive semiconductor region having a first dopant concentration over one major surface of a conductive semiconductor substrate; a second step of forming a second reverse conductive semiconductor region having a second dopant concentration which is higher than the first dopant concentration over the one major surface of the conductive semiconductor substrate; and a third step of forming the horizontal shift register on the first reverse conductive semiconductor region and the output section on the second reverse conductive semiconductor region.

DESCRIPTION OF THE PREFERRED EMBODIMENT

Figure 4:
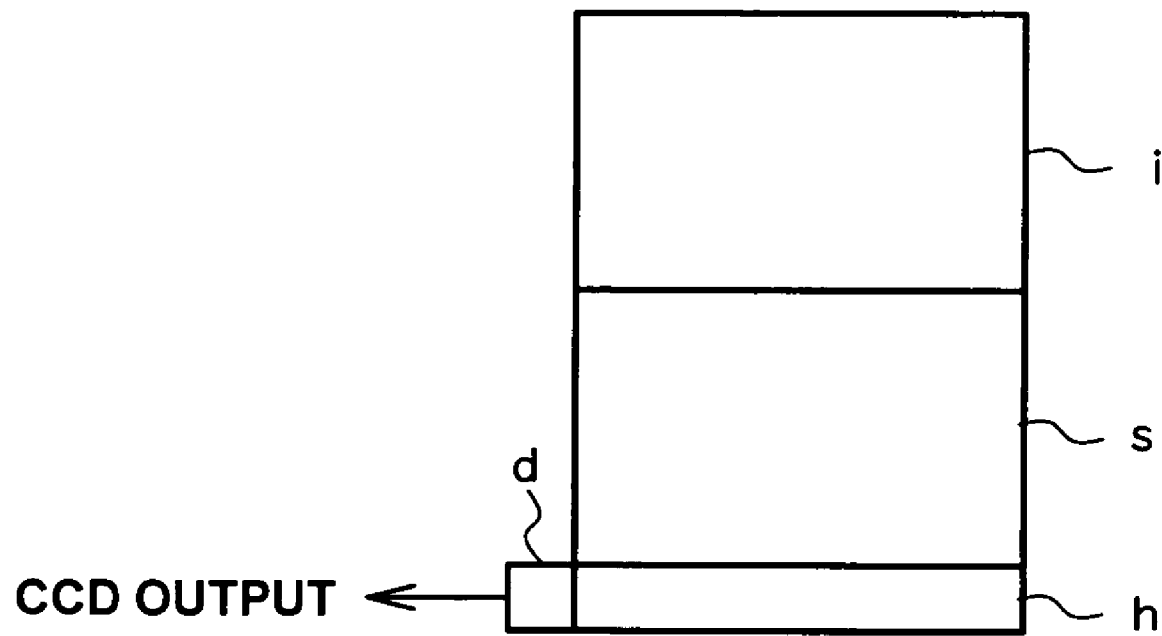
FIG. 4 is a schematic structural diagram showing a CCD solid image capturing element using a frame transfer method.

In the following, a preferred embodiment of the present invention will be described with reference to the accompanied drawings. In the following description, a CCD solid image capturing element using a frame transfer method will be referred to. The structure of a CCD solid image capturing element using a frame transfer method is schematically shown in FIG. 4, which is incorporated in the following description.

As described above, a CCD solid image capturing element using a frame transfer method comprises an image capturing section i, a storage section s, a horizontal transfer section h, and an output section d. The image capturing section i comprises a plurality of shift registers, vertically extending in the drawing, respectively arranged in parallel, in which each bit in each shift register forms photo diffusion and constitutes a light receiving pixel. The storage section s comprises a plurality of light-shielded shift registers continuing from the respective shift registers of the image capturing section i, in which each bit in each shift register constitutes a storage pixel. The horizontal transfer section h comprises a single horizontally extending shift register, in which each bit in the register is coupled to an output from each of the plurality of shift registers of the storage section s. The output section d comprises a capacitance for temporally storing charge from the horizontal transfer section h and a rest transistor for discharging the stored charge.

With this arrangement, information charge stored in the respective light receiving pixels in the image capturing section i is transferred individually for each pixel to the storage pixels in the storage section s, then further to the horizontal transfer section h for each pixel row, and still further to the output section d for each pixel. The output section d converts the information charge for each pixel into a voltage having a corresponding value. A change in the voltage value is output as a CCD output to be supplied to an external circuit.

Figure 1:
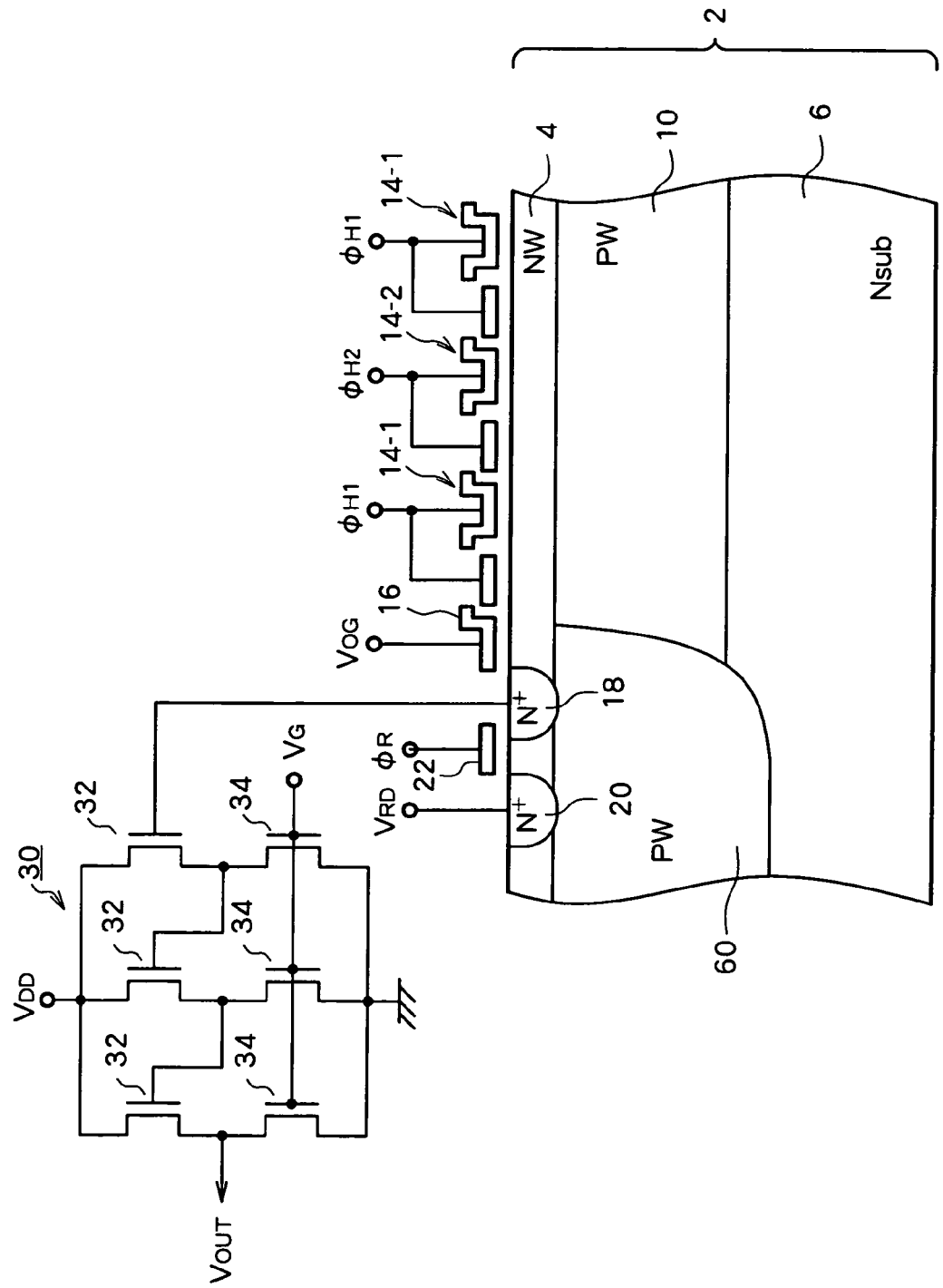
FIG. 1 is a schematic cross sectional view along an electric charge transfer direction in a horizontal shift register of a CCD solid image capturing element according to an embodiment of the present invention.

FIG. 1 is a cross sectional view along a charge transfer direction in a horizontal shift register (H-REG), showing an output terminal of the horizontal shift register and its nearby portion and, additionally, a floating diffusion layer (FD) 18 and a reset drain (RD) 20 which constitute a part of the output section d. It should be noted that the cross sectional view along a charge transfer direction in a vertical shift register (V-REG) in this embodiment is identical to that of FIG. 5, which is incorporated in the following description.

Specifically, into an N-type silicon substrate 2, P-type dopant ions are doped and then diffused. Thereafter, N-type dopants are doped and then diffused. As a result, on the surface of the substrate 2, an N-well (NW) 4 is formed which is an N-type diffusion layer 4 comprising the N-type dopant doped, and a P-well (PW) is formed between the N-well 4 and the N-type layer 6 ($N_{sub}$) of the original substrate, which is a P-type diffusion layer comprising the P-type dopant ions which were doped before the N-type dopant.

Figure 5:
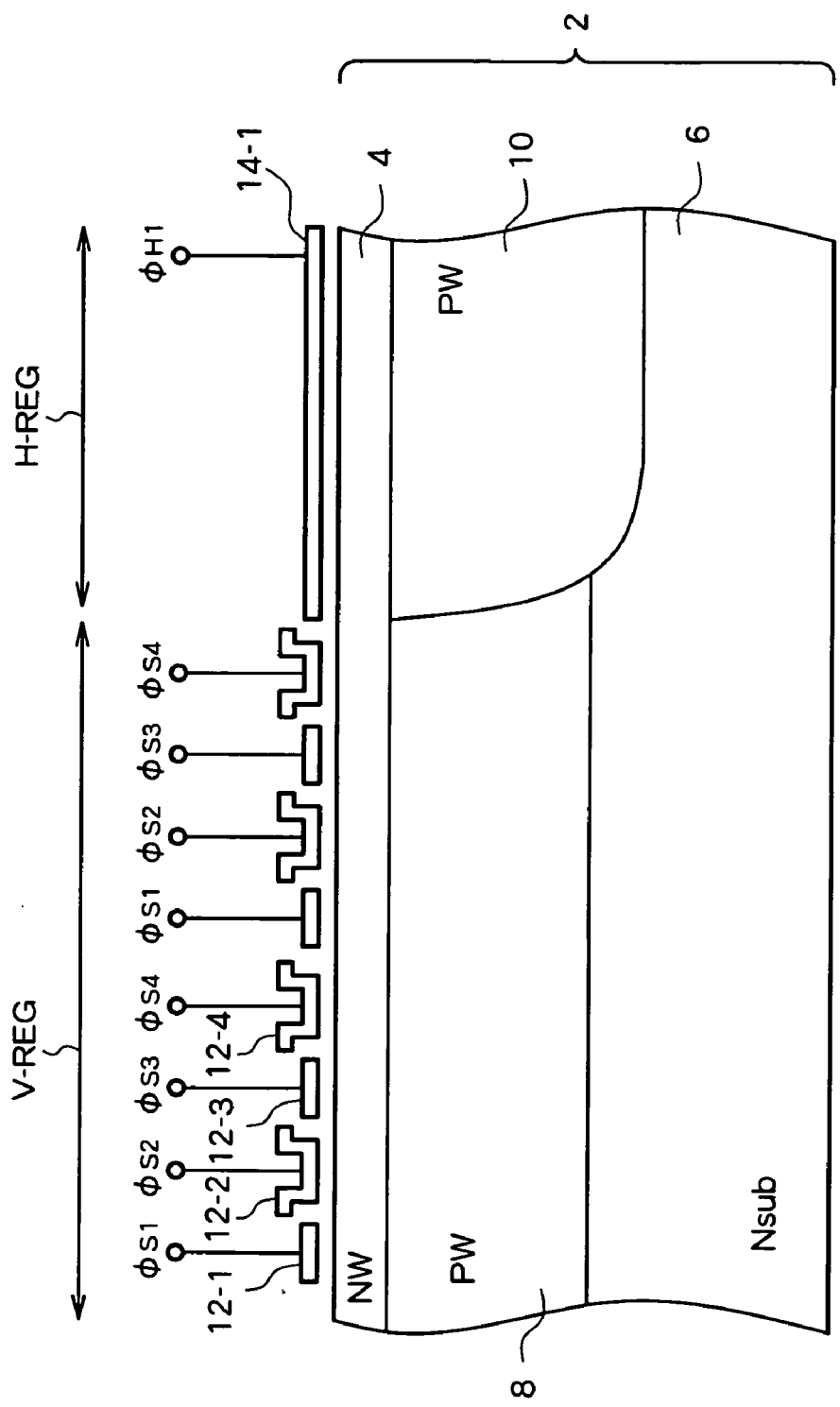
FIG. 5 is a schematic cross sectional view along an electric charge transfer direction in a vertical shift register of a CCD solid image capturing element.
Figure 6:
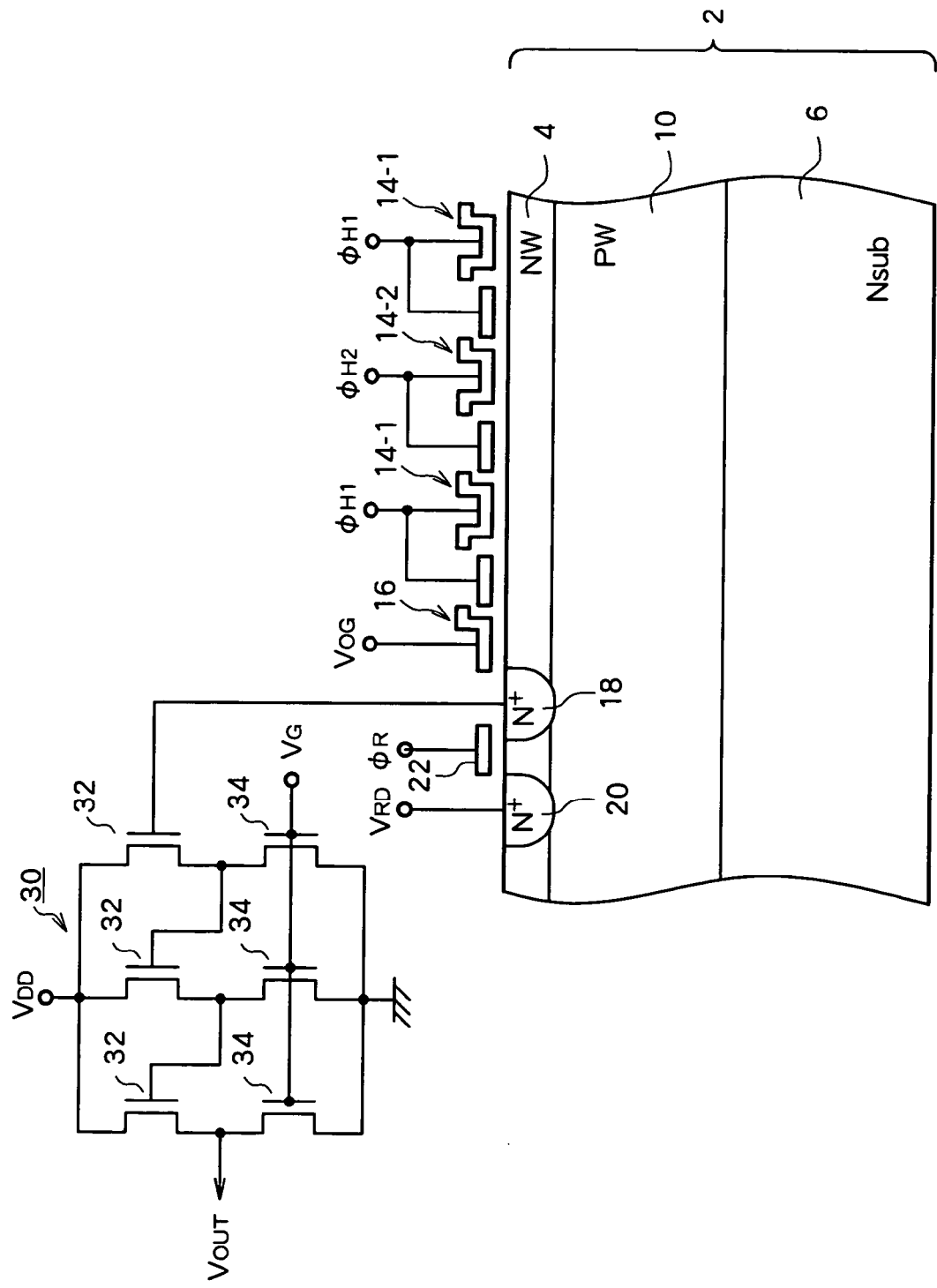
FIG. 6 is a schematic cross sectional view along an electric charge transfer direction in a horizontal shift register of a conventional CCD solid image capturing element.

In this embodiment, doping of P-type dopant ions for formation of a P-well is performed three times in different regions, so that three P-wells 8, 10, and 60 having different dopant concentrations are formed. Specifically, the P-well 8 having the lowest dopant concentration of the three kinds is formed in the image capturing section i and the storage section s; the P-well 10 having the middle dopant concentration of the three kinds is formed in the horizontal transfer section h; and the P-well 60 having the highest dopant concentration is formed in the output section d. FIG. 5 shows the P-wells 8 and 10, while FIG. 1 shows P-wells 10 and 60.

On the surface of the substrate, electrodes are formed via oxide films (not shown). Specifically, electrode groups 12-1 to 12-4 to be driven by four-phase vertical transfer clocks $\phi_{S1}$ to $\phi_{S4}$ are formed in the vertical shift register of the storage section s, and electrode groups 14-1 and 14-2 to be driven by two-phase horizontal transfer clocks $\phi_{H1}$ and $\phi_{H2}$ are formed in the horizontal shift register.

Through sequential application of a positive voltage to the respective electrode groups, potential wells are sequentially formed in the N-well 4 under the respective electrodes to which the voltage is applied and, resultantly, an information charge to be stored in the potential wells moves in the N-well 4. As an example, referring to FIG. 5, information charges are sequentially transferred in the rightward direction in the drawing in the vertical shift register until they are read into a potential well below the electrode 14-1 in the horizontal shift register. As another example, referring to FIG. 1, information charges are sequentially transferred in the leftward direction in the drawing in the horizontal shift register until, passing under the output gate (OG) 16 which receives a DC voltage, they finally reach the floating diffusion layer 18.

The floating diffusion layer 18 is an $N^+$ diffusion layer and, together with a P-well coupled thereto, form floating diffusion. The floating diffusion layer 18, a reset drain 20, and a reset gate (RG) 22 together constitute a reset transistor. The reset drain 20 is formed by an $N^+$ diffusion layer and maintained at a constant positive voltage $V_{RD}$. In this embodiment, a power voltage $V_{DD}$ may be applied as a reset drain voltage $V_{RD}$.

When a channel below the reset gate 22 is turned on in response to a reset clock $\phi_R$ applied to the reset gate 22, the potential of the floating diffusion layer 18 is set at the reset drain voltage $V_{RD}$, whereby the PN junction of the floating diffusion is reversely biased. When the reset gate 22 remains in an off state, on the other hand, the PN junction of the floating diffusion remains in an electrically floating state (a floating state). When an information charge from the horizontal shift register is supplied to the PN junction in the floating state, the supplied information charge is temporarily stored in the PN junction capacitance, so that the potential in the floating diffusion layer 18 varies according to the amount of the stored information charge. This potential variation is detected and amplified by the output amplifier 30, which in turn outputs a voltage $V_{OUT}$ as a CCD output.

The output amplifier 30 is formed as a three-stage source follower circuit, for example, using a MOS transistor formed in the silicon substrate 2. Specifically, the drain and source of the driving transistor 32 and the load transistor 34 of the output amplifier 30 are formed by $N^+$ diffusion layers on the surface of the silicon substrate 2, and a channel formed in a semiconductor region in the substrate between the drain and the source is controlled using a gate electrode which is formed by poly-silicon electrode layers on gate oxide films. In this embodiment, a power voltage $V_{DD}$ (for example, 2.9 V) which is lower than a voltage applied in a conventional structure is applied to the reset drain 20 of the output section d and a drain diffusion layer of the drive transistor 32 of the output amplifier 30 for suppression of power consumption.

When the P-well and the N-well are formed in the silicon substrate 2, as described above, an NPN structure is formed into the substrate. In this structure, a redundant electric charge on the surface of the substrate can be discharged to the back surface side of the substrate in the image capturing section i and the storage section s.

Figure 2:
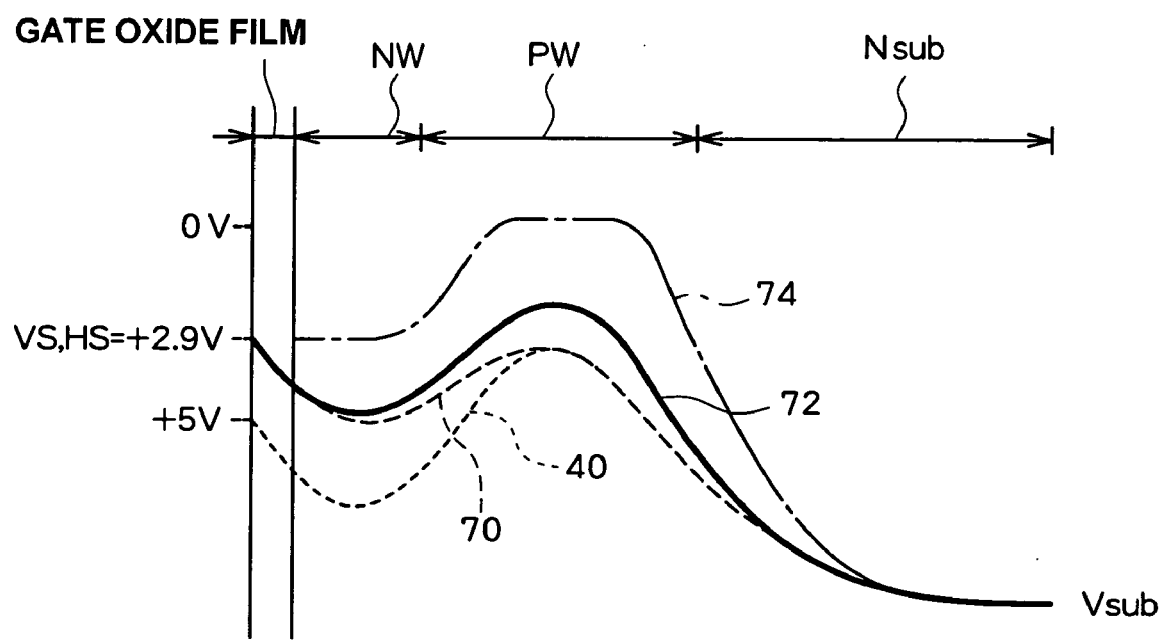
FIG. 2 is a schematic diagram showing potential distribution in a depth direction of a substrate of the CCD solid image capturing element according to the embodiment of the present invention.
Figure 7:
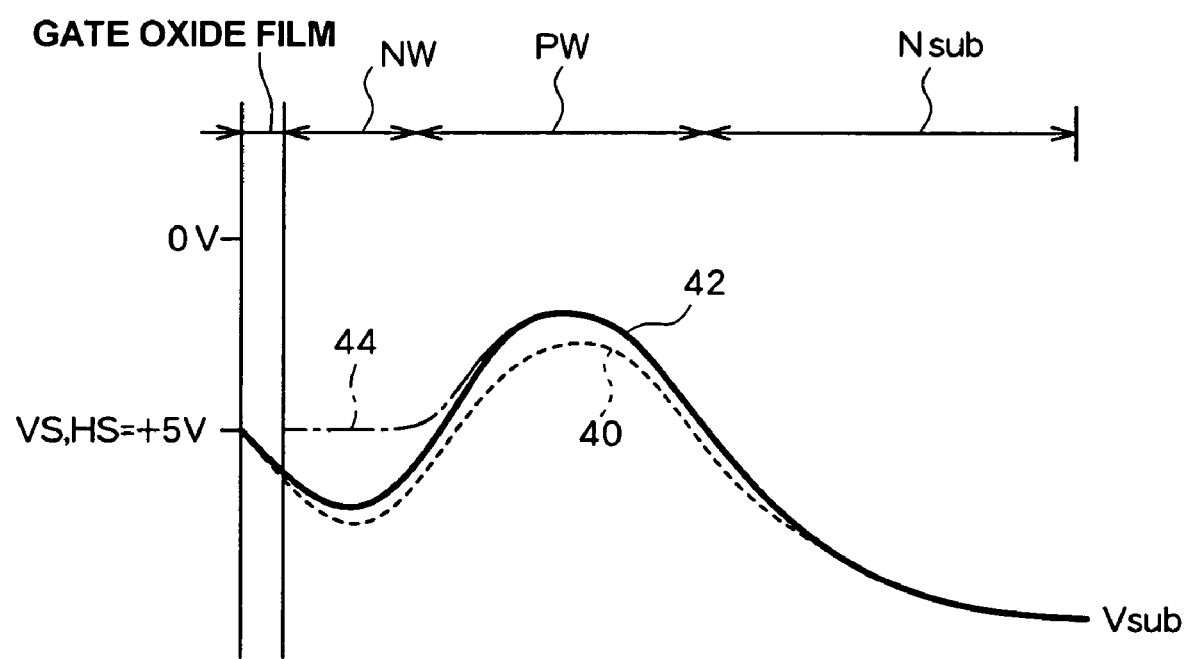
FIG. 7 is a schematic diagram showing potential distribution in a depth direction of a substrate of a conventional CCD solid image capturing element.

FIG. 2 schematically shows potential distribution in the depth direction of the substrate. This drawing corresponds to FIG. 7 which concerns the related art and the ordinate and abscissa of the drawing are assigned in the same manner as in FIG. 7.

The potential distribution curve 70 corresponds to a vertical shift register which constitutes an image capturing section i or a storage section s, representing potential distribution in an NPN structure which comprises an N-well 4, a P-well 8, and an $N_{sub}$ 6. The potential distribution curve 72 corresponds to a horizontal transfer section h (H-REG), representing potential distribution in an NPN structure which comprises an N-well 4, a P-well 10, and an $N_{sub}$ 6. The potential distribution curve 74 represents potential distribution in an NPN structure in the output section d, which receives a power voltage $V_{DD}$ and comprises an $N^+$ diffusion layer, the P-well 60, and the $N_{sub}$ 6.

The curves 70 and 72 relate to cases in which a voltage (for example, 2.9 V) which is lower than a voltage applied in a conventional structure is applied as a positive voltage VS, HS corresponding to an on-state to the transfer electrode 12 and 14 of the vertical and horizontal shift register, respectively, to thereby reversely bias the region between the P-well and the N-well 4 and, moreover, the transfer channel is completely depleted. For easier comparison with the related art, the curve 40 is also shown in FIG. 2, which relates to a case in which a voltage 5V is applied to the transfer electrode 12 of a vertical shift register. Relating to any of the curves 70, 72, and 40, a predetermined positive $V_{sub}$ (for example, 8 V) is applied to the back side of the substrate to thereby reversely bias the region between the P-well and the $N_{sub}$ 6.

In this structure, differences in dopant concentrations between the P-well 8 below the vertical shift register and the P-well 10 below the horizontal shift register are utilized to realize a configuration in which a higher potential barrier is formed in the P-well in the horizontal shift register (curve 74) than in the vertical shift register (curve 72) to serve as a barrier relative to the electron moving from the N-well 4 to the $N_{sub}$ 6. With this difference in the height of the barrier, in a vertical overflow drain operation and in an electronic shutter operation, information charge can be discharged to the $N_{sub}$ 6 only in the image capturing region i and the storage region s but not in the horizontal transfer section h.

Here, when the dopant concentration in the P-well 10 is excessively high, a potential well in the N-well 4 is problematically formed in a position excessively closer to the surface of the substrate. In other words, potential distribution in the depth direction is formed such that the minimum value is marked relative to a position excessively closer to the surface of the substrate. Then, the charge would be trapped by a lattice defect caused in the boundary between the oxide film and the surface of the substrate, and the transfer efficiency of the information charge is thus deteriorated. Therefore, in order to address this problem, the dopant concentration of the P-well 10 is determined such that information charges do not contact the boundary between the gate oxide film and the p-well.

When a power voltage $V_{DD}$ is reduced, as is in this embodiment, the potential of the $N^+$ diffusion layer and the channel of the transistor of the output section becomes shallow. The potential may become even shallower than the potential of the transfer channel in the horizontal shift register which would be realized when a voltage equal to the power voltage $V_{DD}$ is applied to the transfer electrode 14. A shallow potential of the $N^+$ diffusion layer and the channel of the transistor increases the likelihood of leakage of electric charge.

In order to address this problem, the dopant concentration of the P-well 60 below the output section is set higher than that for the P-well 10 below the horizontal shift register so that punch-through between the $N^+$ diffusion layer and the channel and the $N_{sub}$ 6 in the output section can be prevented. Specifically, the dopant concentration of the P-well 60 is determined such that the potential of the floating diffusion layer 18 becomes deeper than that below the transfer electrode 14-1 in an off state and that a sufficient fringe electric field can be obtained from the last-stage transfer electrode to the floating diffusion layer 18 that can ensure satisfactory transfer efficiency.

Figure 3A:
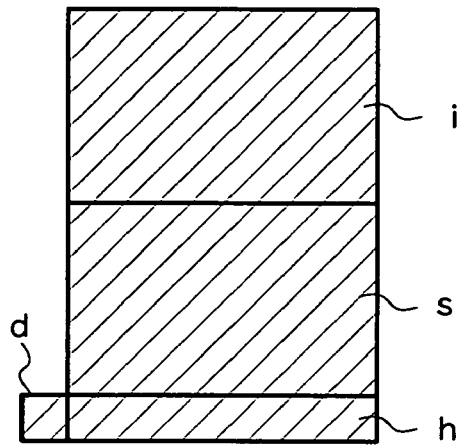
FIG. 3 is a schematic top view of an element for explaining manufacturing of a P-well in a CCD solid image capturing element according to the embodiment of the present invention.

FIG. 3 is a schematic top view of an element for explaining manufacturing of a P-well in a CCD solid image capturing element in this embodiment. Specifically, a P-type dopant ion is doped into an element formation region on the surface of the N-type silicon substrate 2 and then diffused using heat. With this first stage of p-type dopant introduction, a first p-type diffusion layer having a first dopant profile is formed in the depth direction in a region (shown as a hatched region in FIG. 3(a)) where an image capturing section i, a storage section s, a horizontal transfer section h, and an output section d are to be formed.

Figure 3B:
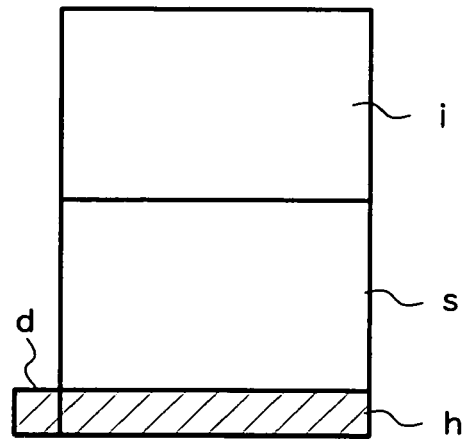

Subsequently, a resist pattern having an opening in a position corresponding to a region (shown as a hatched region in FIG. 3(b)) where a horizontal transfer section h and an output section d are to be formed is formed on the surface and, thereafter, using the resist as a mask, second p-type dopant ion doping is applied. With this second stage of p-type dopant introduction, a second p-type diffusion layer having a second dopant profile which is combined with the first dopant profile already formed is formed in a region where a horizontal transfer section h and an output section d are to be formed.

Figure 3C:
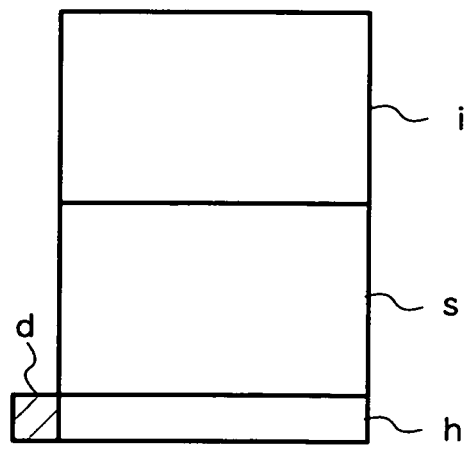

Thereafter, a resist pattern having an opening in a position corresponding to a region (shown as a hatched region in FIG. 3(c)) where an output section d is to be formed is formed on the surface of the substrate 2 and, thereafter, using the resist as a mask, third p-type dopant ion doping is applied, followed by heat diffusion. With this third stage of p-type dopant introduction, a third p-type diffusion layer having a third dopant profile which is combined with the second dopant profile already formed is formed in a region where an output section d is to be formed. In the above, masks for ion doping and heat diffusion or the like are designed such that the boundary between the P-well 60 and the output end of the horizontal shift register is formed finally below the output gate 16.

After formation of the first, second, and third p-type diffusion layers through three-stage processing described above, N-type dopant ions are doped into the P-type diffusion layers and then diffused so as to spread to depths shallower than the depths to which the p-type dopant ions spread. Consequently, an N-type diffusion layer, which is formed closer to the surface of the substrate than the p-type diffusion layer, constitutes an N-well 4, while the first to third P-type diffusion layers, which are formed in the deeper portions than the N-type diffusion layer, constitute the P-wells 8, 10, 60, respectively.

Subsequent processes are basically identical to those in the conventional art. Specifically, using a predetermined resist pattern as a mask, P-type dopant ions having a high concentration are doped to form a separation region (a channel stop). Then, covering the separation region and the N-well 4, a gate oxide film is formed over the substrate 2. Further, a polysilicon film is formed over the gate oxide film, and then patterned to thereby form a plurality of transfer electrodes 12 and 14.

As described above, when it is arranged that the semiconductor region in an output section d has a higher dopant concentration than the semiconductor region in a horizontal shift register, the semiconductor region in the output section d can be prevented from being completely depleted. Even though the region should be depleted to some extent, because a higher potential barrier is created in the semiconductor region in the output section d than in the horizontal shift register, leakage of electric charges from the output section d and thus deterioration in transfer efficiency in the horizontal shift register can be prevented.

Moreover, when it is arranged such that the semiconductor region in a horizontal shift register has a higher dopant concentration than a plurality of light receiving pixels and a plurality of vertical shift registers, transfer of information charges from the light receiving pixels and the vertical shift registers to the horizontal shift register can be achieved with high transfer efficiency. Further, because a depletion layer in a semiconductor region of the horizontal shift register can be prevented from being trapped by a defective level of an oxide film formed on the element surface, stable transfer of information charge can be achieved.

According to the present invention, even when a reduced power voltage is applied to an output section for suppression of power consumption, leakage of electric charge between the output section on the front surface of the substrate and the back surface of the substrate can be suppressed.

What is claimed is:

1. A solid image capturing element, comprising:
    a plurality of vertical shift registers arranged to each column of a plurality of light receiving pixels in a matrix arrangement,
    a horizontal shift register provided on an output side of the plurality of vertical shift registers, and
    an output section provided on an output side of the horizontal shift register,
    wherein
    a semiconductor region of a first conductive type is formed closest to a shift register-side surface of a semiconductor substrate of the first conductive type, while a semiconductor region of a second conductive type which is different from the first conductive type is formed in a portion farther from the shift register-side surface than the semiconductor region of the first conductive type, and
    a first semiconductor region and a second semiconductor region having a higher dopant concentration than that of the first semiconductor region are formed in the semiconductor region of the second conductive type,
    the horizontal shift register is formed above the first semiconductor region; and
    the output section is formed above the second semiconductor region.

2. The solid image capturing element according to claim 1, further comprising:
    an output gate formed on the semiconductor substrate at a boundary between the horizontal shift register and the output section.

3. The solid image capturing element according to claim 1, wherein
    in the semiconductor region of reverse conductive type, a third semiconductor region having a lower dopant concentration than that of the first semiconductor region is formed, and
    the plurality of vertical shift registers are formed in the third semiconductor region.

4. A method for manufacturing a solid image capturing element having a plurality of vertical shift registers arranged to each column of a plurality of light receiving pixels in a matrix arrangement, a horizontal shift register provided on an output side of the plurality of vertical shift registers, and an output section provided on an output side of the horizontal shift register, comprising:
    a first step of forming closest to a shift register-side surface of a semiconductor substrate of a first conductive type; a semiconductor region of the first conductive type;
    a second step of forming a semiconductor region of a second conductive type which is different from the first conductive type in a portion farther from the shift register-side surface than the semiconductor region of the first conductive type; and
    a third step of forming, in the semiconductor region of the second conductive type, a first semiconductor region and a second semiconductor region having a dopant concentration higher than the dopant concentration of the first semiconductor region, and the horizontal shift register above the first semiconductor region and the output section above the second semiconductor region.

5. The method for manufacturing a solid image capturing element according to claim 4, further comprising:
    a fourth step of forming in the semiconductor region of the second conductive type, a third conductive semiconductor region having a third dopant concentration which is lower than the first dopant concentration,
    wherein
    at the fourth step, the plurality of light receiving pixels and the plurality of vertical shift registers are formed in the third semiconductor region.

6. The method for manufacturing a solid image capturing element according to claim 4, wherein a dopant is doped in a stepwise manner to the first semiconductor region and the second semiconductor region, and
    doping of the dopant is performed commonly at least once to the first semiconductor region, the second semiconductor region, and the third conductive semiconductor region.

* * * * *